United States Patent
Waragaya (10) Patent No.: US 9,903,542 B2
(45) Date of Patent: Feb. 27, 2018

(54) SEMICONDUCTOR LIGHT-EMITTING APPARATUS AND VEHICLE HEADLIGHT

(71) Applicant: Stanley Electric Co., Ltd., Tokyo (JP)

(72) Inventor: Takeshi Waragaya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 219 days.

(21) Appl. No.: 14/937,823

(22) Filed: Nov. 10, 2015

(65) Prior Publication Data

US 2016/0131314 A1 May 12, 2016

(30) Foreign Application Priority Data

Nov. 11, 2014 (JP) ................................. 2014-229111

(51) Int. Cl.
*F21K 99/00* (2016.01)
*H01S 5/323* (2006.01)
(Continued)

(52) U.S. Cl.
CPC ............... *F21K 9/56* (2013.01); *F21K 9/64* (2016.08); *F21S 48/1145* (2013.01); *F21S 48/125* (2013.01); *H01S 5/005* (2013.01); *H01S 5/02212* (2013.01); *H01S 5/02252* (2013.01); *H01S 5/22* (2013.01); *H01S 5/32341* (2013.01); *F21Y 2101/00* (2013.01);
(Continued)

(58) Field of Classification Search
None
See application file for complete search history.

(56) References Cited

U.S. PATENT DOCUMENTS 8,115,106 B2  2/2012  Tanaka et al.
8,373,182 B2  2/2013  Seko et al.
(Continued)

FOREIGN PATENT DOCUMENTS

EP  1 306 944 A1  5/2003
EP  2 713 410 A1  4/2014
(Continued)

OTHER PUBLICATIONS

The extended European search report for the related European Patent Application No. 15193909.7 dated Feb. 5, 2016.

*Primary Examiner* — Britt D Hanley
(74) *Attorney, Agent, or Firm* — Kenealy Vaidya LLP (57) ABSTRACT

A reliable semiconductor light-emitting apparatus and a headlight using the light-emitting apparatus provided with a laser chip having a diffraction performance and a wavelength converting board. The wavelength converting board can uniformly receive a laser beam emitted from the laser chip, which includes a laser beam having a relatively high intensity near an optical axis of the laser chip, from an incident surface thereof by locating the wavelength converting board with a prescribed locating relation with respect to the laser chip, and can emit a mixture light having a substantially uniform color tone including white light and a high light-emitting intensity from a light-emitting surface thereof. Thus, the disclosed subject matter can provide reliable semiconductor light-emitting apparatuses that can emit various color lights having favorable optical characteristics, which can also include the optical fiber, and which can be used for the headlight that can provide a favorable light distribution pattern.

19 Claims, 7 Drawing Sheets (51) Int. Cl.
    *H01S 5/022*     (2006.01)
    *H01S 5/22*     (2006.01)
    *F21S 8/10*     (2006.01)
    *H01S 5/00*     (2006.01)
    *F21K 9/64*     (2016.01)
    *F21Y 101/00*     (2016.01)
    *F21Y 115/30*     (2016.01)

(52) U.S. Cl.
    CPC ....... *F21Y 2115/30* (2016.08); *H01S 5/02284* (2013.01); *H01S 5/02288* (2013.01); *H01S 5/02292* (2013.01)

(56) References Cited

U.S. PATENT DOCUMENTS

| | | |
|---|---|---|
| 8,860,061 B2 | 10/2014 | Kotani |
| 9,147,814 B2 | 9/2015 | Waragaya |
| 2014/0197445 A1 | 7/2014 | Saito et al. |

FOREIGN PATENT DOCUMENTS

| | | |
|---|---|---|
| EP | 2 716 961 A1 | 4/2014 |
| EP | 2 738 888 A2 | 6/2014 |
| JP | 2003-282952 A | 10/2003 |
| JP | 2007-188059 A | 7/2007 |
| JP | 2010-165834 A | 7/2010 |

SEMICONDUCTOR LIGHT-EMITTING APPARATUS AND VEHICLE HEADLIGHT

This application claims the priority benefit under 35 U.S.C. § 119 of Japanese Patent Application No. 2014-229111 filed on Nov. 11, 2014, which is hereby incorporated in its entirety by reference.

BACKGROUND

1. Field

The presently disclosed subject matter relates to semiconductor light-emitting apparatuses in which light emitted from a semiconductor laser device is wavelength-converted by a wavelength converting board, and to vehicle headlights using the semiconductor light-emitting apparatuses. More particularly, the disclosed subject matter relates to reliable semiconductor light-emitting apparatuses having favorable optical characteristics, which can be used for a vehicle headlight with a simple structure, and to the vehicle headlights using such light-emitting apparatuses.

2. Description of the Related Art

Semiconductor light-emitting devices, in which a part of light emitted from a semiconductor light-emitting chip is converted into light having a different wavelength by a wavelength converting layer and in which a mixture light including the light having the different wavelength mixed with the light emitted directly from the light-emitting chip is emitted, have been used as a light source for various lighting units. In this case, semiconductor light-emitting devices, in which the semiconductor light-emitting chip may be located at a desired position by using an optical fiber, have also been known.

Figure 7:
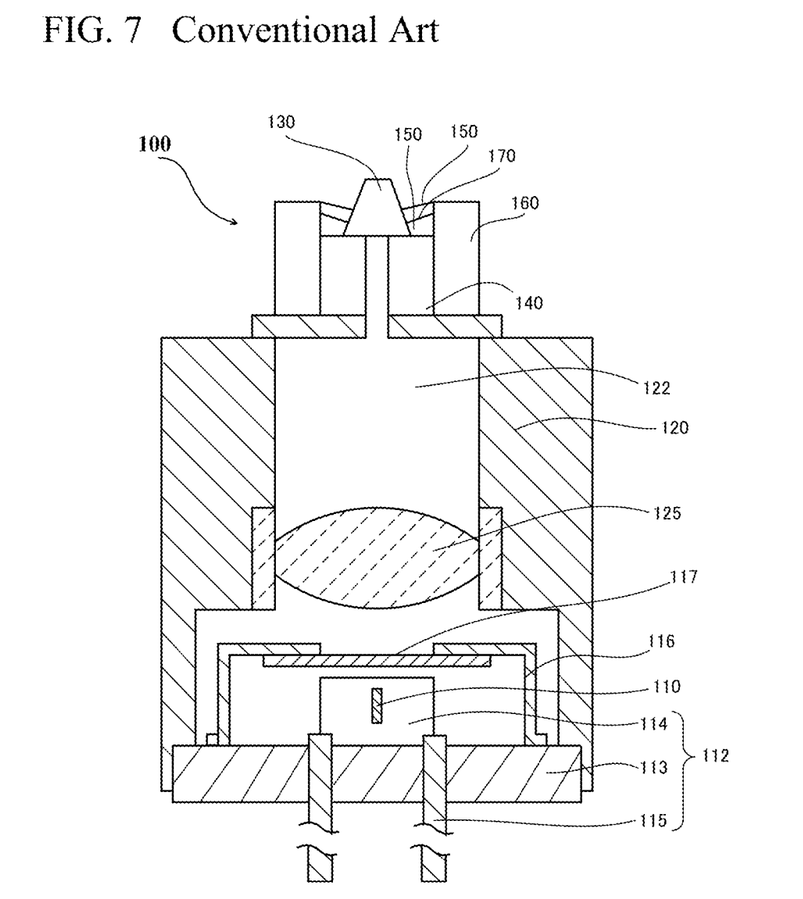
FIG. 7 is a schematic enlarged side cross-sectional view showing a conventional semiconductor light-emitting device.

Conventional semiconductor light-emitting devices including a wavelength converting layer and an optical fiber are disclosed in Patent Document No. 1 (Japanese Patent Application Laid Open JP2010-165834). FIG. 7 is a schematic enlarged side cross-sectional view showing a conventional semiconductor light-emitting device, which is disclosed in Patent Document No. 1.

The conventional semiconductor light-emitting device 100 includes: a stem 112 having a base 113, a body 114 and leads 115; a semiconductor light-emitting chip 110 attached to the body 114 of the stem 112 and being electrically connected to the leads 115 of the stem 112; a cap 116 including a window 117, and covering the semiconductor light-emitting chip 110 so that light emitted from the semiconductor light-emitting chip 110 transmits the window 117; a holder 120 including a lens 125 and a hole 122, which may pass through the light emitted from the semiconductor light-emitting chip 110; a supporting member 140; a fixing member 150 located on the supporting member 140; a sleeve 160 attaching the supporting member 140 along with the fixing member 150; and a wavelength converting material 130 attached on the supporting member 140 and attached to the fixing member 150 via a welding 170.

Accordingly, the conventional semiconductor light-emitting device 100 may emit a mixture light including a part of light emitted directly from the semiconductor light-emitting chip 110 with light having a different wavelength wavelength-converted by the wavelength converting material 130 using another part of the light emitted directly from the semiconductor light-emitting chip 110. In this case, when a blue LED chip is used as the semiconductor light-emitting chip 110 and when the wavelength converting material 130 contains a yellow phosphor such as YAG, the conventional semiconductor light-emitting device 100 may substantially white light by an additive color mixture of an excited yellow light emitted from the yellow phosphor and a part of the blue light emitted from the blue LED chip, and therefore may used as a light source for a vehicle headlight, etc.

When semiconductor light-emitting devices including a light-emitting chip are employed as a light source for vehicle lamps such as a headlight, a position light, a room light, etc. the vehicle lamps may generally require optical devices such as a reflector, a diffusing lens, a projector lens and the like to provide a prescribed light distribution. Hence, it may be preferable for the vehicle lamps to form the optical devices in a small size with a simple structure, and also it may be preferable for the optical devices to from the semiconductor light-emitting devices in a small size with a simple structure such that is easily attached to the optical devices.

In addition, when semiconductor light-emitting devices are employed as the light source for the vehicle lamps such as the headlight, the headlight must emit a large amount of strong lights having a substantially white color tone by using an additive color mixture of an excited yellow light emitted from the yellow phosphor and a part of the blue light emitted from the light-emitting chip, so as to brightly illuminate roadway surfaces under various conditions such as a rainy weather, a misty roadway surface, etc.

In the above-described conventional semiconductor light-emitting device 100, after the wavelength converting material 130 is placed on the supporting member 140 while the material 130 is surrounded by the fixing member 150, the wavelength converting material 130 may be attached on the supporting member 140 and to the fixing member 150 via the welding 170. Accordingly, the wavelength converting material 130 may be subject to a misalignment with reference to light emitted from the semiconductor light-emitting chip 110 because of said fixing process of the wavelength converting material 130.

In this case, the semiconductor light-emitting device 100 may emit light having a slightly color variation with respect to prescribed white color light due to the misalignment with reference to the light emitted from the semiconductor light-emitting chip 110. However, the headlight, in which the semiconductor light-emitting device 100 having such a structure is combined with the optical devices such as the reflector, the projector lens and the like, may emit the strong light having a considerable non-uniform white color tone toward the road because the light having a slightly color variation is enlarged by the optical devices and may be projected toward the road.

Therefore, the headlight using the conventional semiconductor light-emitting device 100 may continuously not provide drivers with clear road conditions to drive safely at night. Additionally, the conventional semiconductor light-emitting device 100 may not necessarily become a simple structure as described above.

The above-referenced Patent Documents and additional Patent Documents are listed below, and are hereby incorporated with their English abstracts in their entireties.

1. Patent Document No. 1: Japanese Patent Application Laid Open JP2010-165834
2. Patent Document No. 2: U.S. Pat. No. 8,860,061
3. Patent document No. 3: U.S. patent application Ser. No. 14/745,402
4. Patent document No. 4: U.S. Pat. No. 9,147,814

The presently disclosed subject matter has been devised to consider the above and other problems, features, and characteristics in the conventional art devices. Embodiments of the disclosed subject matter can include reliable semiconductor light-emitting apparatuses that can emit mixture lights having favorable optical characteristics such as a high uniform color tone, a high light-emitting intensity and the like, which can be used for a vehicle lamp and the like, and which can also include an optical fiber. Accordingly, the semiconductor light-emitting apparatuses can emit the mixture lights including a substantially white color tone having a high light-emitting intensity from a small light-emitting surface, which can be used for lighting units such as a vehicle headlight that controls light emitted from the light-emitting apparatus using a reflector and/or a projector lens. The disclosed subject matter can also include a vehicle headlight using the semiconductor light-emitting apparatuses that can form a favorable light distribution pattern with a simple structure.

SUMMARY

The presently disclosed subject matter has been devised in view of the above and other problems, features, and characteristics in the conventional art, and to make changes to existing semiconductor light-emitting apparatuses. Thus, an aspect of the disclosed subject matter provides reliable semiconductor light-emitting apparatuses that can emit various color lights including a substantially white color light having favorable optical characteristics, which can be used for a vehicle lamp and the like, and which can also include an optical fiber. Another aspect of the disclosed subject matter provides vehicle headlights using the reliable semiconductor light-emitting apparatuses, which can provide a favorable light distribution pattern, even when the semiconductor light-emitting apparatuses have been emitted for a long time in a small sealed housing.

According to an aspect of the disclosed subject matter, a semiconductor light-emitting apparatus can include: a laser chip including an active layer and a ridge structure, which extends in a parallel direction with a laser optical axis of the laser chip, a laser light-emitting surface located in an extending direction of the active layer and located in a direction substantially perpendicular to the active layer, and located on an exposed side surface of the active layer under the ridge structure, therefore a maximum length of a long axis direction of the laser light-emitting surface being within a substantially width of the ridge structure and a maximum width of a short axis direction of the laser light-emitting surface being within a layer thickness of the active layer; and a package having a base board formed in a substantially planar shape, and incorporating the laser chip adjacent the baser board.

In addition, the semiconductor light-emitting apparatus can also include: a holder including a supporter having a supporter opening, and including a fixing frame having a frame opening, the supporter formed in a ring shape or a cylindrical shape, connecting the fixing frame between a peripheral bottom surface of the fixing frame and a supporter top surface of the supporter, attached on the base board of the package via a supporter bottom surface of the supporter, and thereby surrounding the laser chip; and a converting board holder formed in a ring shape, and attached into the frame opening; and a wavelength converting board formed in a substantially planar shape, and incorporated into the converting board holder, wherein the laser optical axis passes though the supporter opening and the frame opening, and intersects with each of an incident surface and a light-emitting surface of the wavelength converting board at a substantially right angle.

In the above-described exemplary semiconductor light-emitting apparatus, the converting board holder can be attached on a holder top surface of the fixing frame, the wavelength converting board can be attached on a board holder top surface of the converting board holder and a reflective body formed in a ring shape can be attached on the board holder top surface so as to surrounding the wavelength converting board. Additionally, the above-described holder can also be replaced with another holder including an optical fiber, which transmits a laser beam emitted from the laser chip toward the wavelength converting board.

In the above-described exemplary semiconductor light-emitting apparatuses, each of the incident surface and the light-emitting surface of the wavelength converting board can be formed in a substantially rectangular shape. A distance between the laser light-emitting surface of the laser chip and the incident surface of the wavelength converting board can be arranged so that a shape of the laser light-emitting surface rotates substantially 90 degrees with respect to an enlarged shape projected on the incident surface of the wavelength converting board in accordance with a length in a longitudinal direction of the ridge structure. The laser light-emitting surface of the laser chip can be formed in a substantially ellipsoidal shape. Additionally, the apparatuses further can include a light diffusing plate formed in a substantially planar shape that is arranged underneath the incident surface of the wavelength converting layer, and also can include an optical lens, which is located between the supporter top surface and the supporter bottom surface of the supporter and crosses the supporter opening so that an optical lens axis thereof corresponds to the substantially optical axis of the laser chip.

According to the above-described exemplary semiconductor light-emitting apparatus, the wavelength converting board can uniformly receive the laser beam emitted from the laser chip, which includes a laser beam having a relatively high intensity near the laser optical axis, from the incident surface thereof by locating the wavelength converting board with the above-described locating relation with respect to the laser chip, and also can emit a mixture light having a substantially uniform color tone and a high light-emitting intensity from the light-emitting surface thereof. Thus, the disclosed subject matter can provide reliable semiconductor light-emitting apparatuses that can emit various color lights including a substantially white color light having favorable optical characteristics, which can be used for a vehicle lamp and the like, and which can also include an optical fiber.

Another aspect of the disclosed subject matter includes vehicle headlights using the above-described semiconductor light-emitting apparatus. An exemplary vehicle headlight can include a projector lens having at least one focus located on a substantially projector optical axis that corresponds substantially to the laser optical axis of the semiconductor light-emitting apparatus, which is located at the substantially focus of the projector lens so that the projector lens face the light-emitting surface of the wavelength converting board of the semiconductor light-emitting apparatus, and a casing attaching the projector lens and the semiconductor light-emitting apparatus.

According to the exemplary vehicle headlight, the disclosed subject matter can provide vehicle headlights using the semiconductor light-emitting apparatus with a simple structure, which can locate the laser chip generating a heat out of the casing thereof. Thus, the disclosed subject matter provides vehicle headlights using the reliable semiconductor light-emitting apparatuses, which can provide a favorable light distribution pattern, even when the semiconductor light-emitting apparatuses have been emitted for a long time in a small sealed housing.

BRIEF DESCRIPTION OF THE DRAWINGS

These and other characteristics and features of the disclosed subject matter will become clear from the following description with reference to the accompanying drawings, wherein:

FIG. 1b is a schematic enlarged cross-sectional view showing the first embodiment of the semiconductor light-emitting apparatus taken along Line V-V shown in FIG. 1a;

DETAILED DESCRIPTION OF EXEMPLARY EMBODIMENTS

Figure 1A:
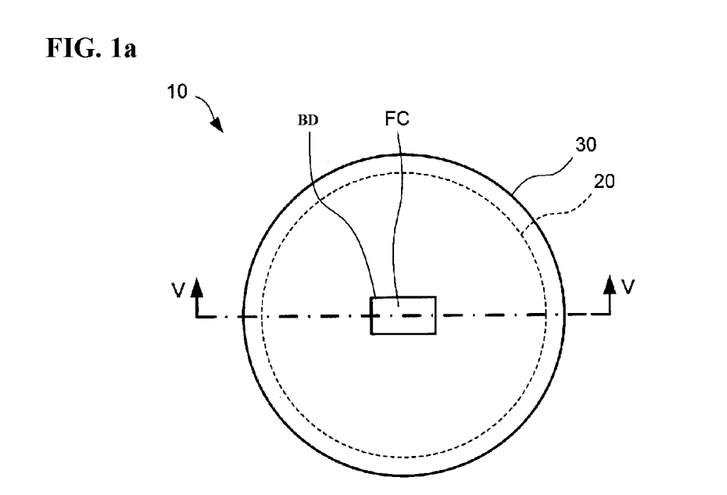
FIG. 1a is a schematic enlarged top view showing a first exemplary embodiment of a semiconductor light-emitting apparatus made in accordance with principles of the disclosed subject matter.
Figure 1B:
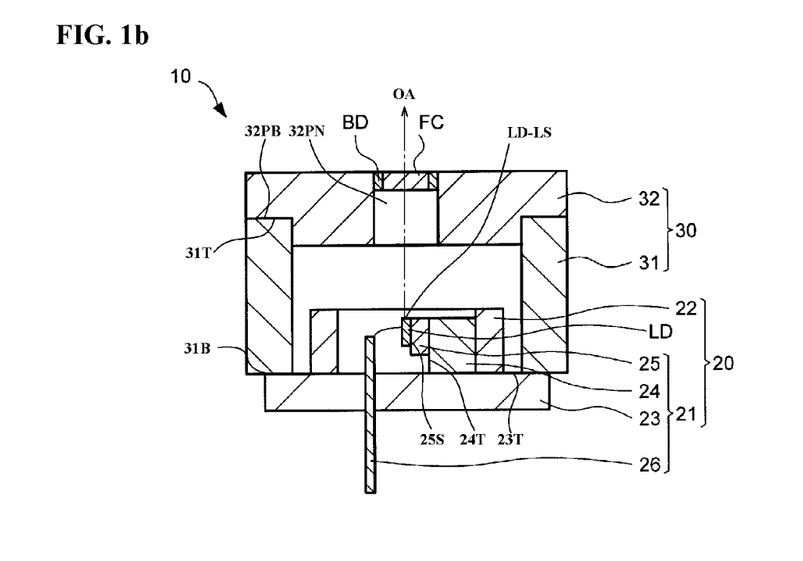

Exemplary embodiments of the disclosed subject matter will now be described in detail with reference to FIG. 1a to FIG. 6b, in which the same or corresponding elements use the same reference marks. FIG. 1a is a schematic enlarged top view showing a first exemplary embodiment of a semiconductor light-emitting apparatus made in accordance with principles of the disclosed subject matter, and FIG. 1b is a schematic enlarged cross-sectional view showing the first embodiment of the semiconductor light-emitting apparatus taken along Line V-V shown in FIG. 1a.

The semiconductor light-emitting apparatus 10 can include a laser chip LD having electrodes, a laser optical axis OA and a laser light-emitting surface LD-LS, and a package 20 including a stem 21 to mount the laser chip LD and a sealing portion 22 to cover the laser chip LD, the stem 21 including a base board 23 having a base top surface 23T, a heat sink 24 having a sink top surface 24T located on the base top surface 23T of the base board 23, a sub mount board 25 having a mounting surface 25S located on the sink top surface 24T of the heat sink 24, the base board 23 formed in a substantially planer shape such as a circle, a box, etc., the heat sink 24 also formed in a substantially planer shape such as a semicircle, a box, etc., the laser chip LD arranged on the mounting surface 25S of the sub mount board 25, each of leads 26 being electrically connected to a respective one of the electrodes of the laser chip LD, the sealing portion 22 formed in a ring shape or a cylindrical shape, attached on the base top surface 23T of the base board 23 of the stem 21 by a welding and the like, and also attached to the heat sink 24 by the welding, etc.

In addition, the semiconductor light-emitting apparatus 10 can include; a holder 30 including a supporter 31 having a supporter top surface 31T and a supporter bottom surface 31B, and including a fixing frame 32 having a frame opening 32PN and a peripheral bottom surface 32PB, the supporter 31 formed in a ring shape or a cylindrical shape and surrounding the sealing portion 22 of the package 20, the holder 30 located on the base top surface 23T of the base board 23 of the package 20 so that the supporter bottom surface 31B of the supporter 31 faces the base top surface 23T of the base board 23, the fixing frame 32 formed in a ring shape or a cylindrical shape and attached to the supporter 31 so that the peripheral bottom surface 32PB of the fixing frame 32 faces the supporter top surface 31T of the supporter 31; a wavelength converting board FC; and a converting board holder BD fixing the wavelength converting board FC, and attached into the frame opening 32BP of the fixing frame 32 along with the wavelength converting board FC.

Each of the sealing portion 22, the base board 23, the heat sink 24, the supporter 31, the fixing frame 32 and the converting board holder BD can include materials having a high thermal conductivity such as copper, aluminum, alumina, aluminum nitride, brass, etc. The converting board holder BD can also attach the wavelength converting board FC into the frame opening 32BP directly by using a thermosetting resin having a high thermal conductivity such as a silicone resin and the like and also by using a soldering paste. The sub mount board 25 can include an aluminum nitride substrate having a high thermal conductivity, a ceramic substrate and the like, as disclosed in patent document No. 2, which is owned by Applicant of this disclosed subject matter. Each of leads 26 can be hermetically sealed, as disclosed in patent document No. 3, which is owned by Applicant of this disclosed subject matter.

Figure 2:
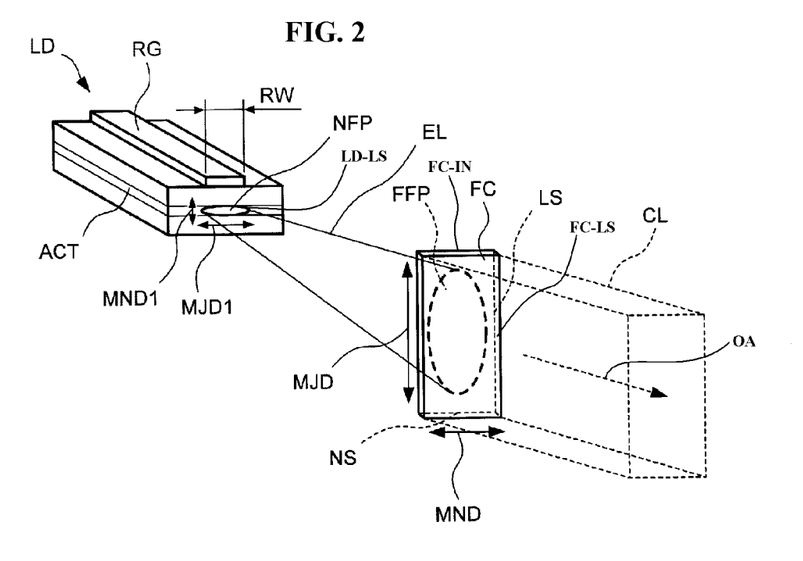
FIG. 2 is an explanatory perspective view depicting a locating relation between a laser chip and a wavelength converting board in the first embodiment of the semiconductor light-emitting apparatus shown in FIGS. 1a and 1b.

FIG. 2 is an explanatory perspective view depicting a locating relation between the laser chip LD and the wavelength converting board FC in the first embodiment of the semiconductor light-emitting apparatus shown in FIGS. 1a and 1b. The laser chip LD can be configured to resonate as Fabry-Perot resonator, and can include a semiconductor layer having multi-layers structure including an active layer ACT and a ridge structure RG, in which a longitudinal direction thereof is used as a resonant direction. In the laser chip LD having the laser light-emitting surface LD-LS, a length of the ridge structure RG can be used as a resonant length, and also a width RW of the ridge structure RG can be used as a resonant width.

The wavelength converting board FC can be formed in a substantially planar shape having an incident surface FC-IN and a light-emitting surface FC-LS, and can be translucent. Laser beam EL emitted from the laser light-emitting surface LD-LS of the laser chip LD can enter into the wavelength converting board FC via the incident surface FC-IN, and can be projected from the light-emitting surface FC-LS of the wavelength converting board FC.

In this case, because the wavelength converting board FC 2 can include a wavelength converting material, the laser beam EL emitted from the laser chip LD can be converted into laser beam having a different wavelength by the wavelength converting board FC and a mixture laser beam CL including the laser beam having the different wavelength mixed with the laser beam EL emitted directly from the laser chip LD can be projected so as to be able to emit the mixture light having a desired color tone. The semiconductor light-emitting apparatus 10 can also emit a desired color light including a substantially white colored light by wavelength-converting substantially all lights emitted from the laser chip LD using the wavelength converting board FC.

When the laser chip LD is a blue laser chip(s) having a peak wavelength of approximately 450 nanometers, for example, which is configured with InGaN series material, and when the wavelength converting board 3 includes a yellow phosphor such as Yttrium aluminum garnet (YAG: $Y_3Al_5O_{12}$: $Ce^{3+}$), the yellow phosphor can emit a yellow light upon being excited by a blue laser beam emitted from the blue laser chip. Accordingly, the semiconductor light-emitting apparatus 10 can emit substantially white light by an additive color mixture of the excited yellow light emitted from the yellow phosphor contained in the wavelength converting board FC and a part of the blue laser beam emitted from the blue laser chip.

When the laser chip LD is a laser diode, for example, a laser diode of InGaN series that emits an ultraviolet laser beam light having a light-emitting wavelength of approximately 380 nanometers, and when the wavelength converting board FC includes at least one of a red phosphor wavelength-converting the ultraviolet laser beam into red light, a green phosphor wavelength-converting the ultraviolet laser beam into green light and a blue phosphor wavelength-converting the ultraviolet laser beam into blue light, the semiconductor light-emitting apparatus 10 can emit various colored lights including a substantially white light by an additive color mixture in accordance with a ratio of the above-described three color phosphors.

The wavelength converting board FC can be made by forming a binder including at least one of the above-described phosphors in a planar shape, and also can be made by using a ceramic plate. Specifically, a YAG phosphor ceramic, which is made by press-sintering a phosphor material dispersing the YAG phosphor into aluminum oxide, can be used. Detail descriptions with respect to the wavelength converting board FC is disclosed in patent document No. 4 by a same inventor as this disclosed subject matter. Accordingly, the detail descriptions are abbreviated here.

Next, an exemplary wavelength converting method of the disclosed subject matter will now be described with reference to FIG. 2. As described above, the laser chip LD can emit the laser beam EL from the laser light-emitting surface LD-LS. The laser beam EL can form a near field pattern NFP on an projecting surface close to the laser light-emitting surface LD-LS, and can form a far field pattern FFP on the substantially incident surface FC-IN of the wavelength converting board FC, where is located a prescribed distance away from the imaginary surface. Each light distribution pattern of the near field pattern NFP and the far field pattern FFP differs from each other.

The near field pattern NFP can be formed in a substantially ellipsoidal shape, in which a long axis direction MJD1 is located in an extending direction of the active layer ACT, and a short axis direction MND1 is located in a direction substantially perpendicular to the active layer ACT. A length of the long axis direction MJD1 can correspond to the width RW of the ridge structure RG, and a width of the short axis direction MND1 can correspond to a layer thickness of the active layer ACT.

On the other hand, the far field pattern FFP can also be formed in a substantially ellipsoidal shape, however, the far field pattern FFP differs from the near field pattern NFP in an area and a direction of the light distribution pattern. Specifically, a long axis direction MJD can be located in a direction substantially perpendicular to the long axis direction MJD1 of the near field pattern NFP, and also a short axis direction MND of the far field pattern FFP is located in a direction substantially perpendicular to the short axis direction MND1 of the near field pattern NFP. Therefore, the long axis direction MJD of the far field pattern FFP can correspond to a direction toward the layer thickness of the active layer ACT, and the short axis direction MND of the far field pattern FFP can correspond to the extending direction of the active layer ACT.

Each of the differences of the area and the direction between the near field pattern NFP and the far field pattern FFP can be caused by diffracting the laser beam EL emitted from the laser chip LD along the short axis direction MND1 of the near field pattern NFP. A reason why the diffraction of the laser beam EL occurs along the short axis direction MND1 of the near field pattern NFP is that the width of the short axis direction MND1 of the near field pattern NFP, that is the layer thickness of the active layer ACT, is shorter than the resonant length of the laser beam EL, which is the length of the ridge structure RG.

In addition, because the length of the long axis direction MJD1 of the near field pattern NFP, that is the width RG of the near field pattern NFP, can be very longer than the width of the short axis direction MND1 of the near field pattern NFP, which is the layer thickness of the active layer ACT, the diffraction of the laser beam EL may not occur along the long axis direction MJD1 of the near field pattern NFP. Thereby, farther the projecting surface of the laser beam EL is away from the laser light-emitting surface LD-LS toward the wavelength converting board FC, wider the projecting surface of the laser beam EL becomes along the short axis direction MND1 of the near field pattern NFP than the long axis direction MJD1 of the near field pattern NFP.

Accordingly, when a distance from the laser light-emitting surface LD-LS is far away from a predetermined distance, which is decided in accordance with the resonant length of the laser beam EL, which is the length of the ridge structure RG, the long axis direction and the short axis direction of the ellipsoidal shape on the projecting surface of the laser beam EL can switch with respect to each other. Consequently, a light distribution pattern of the far field pattern FFP can be formed in a substantially enlarged ellipsoidal shape such that the substantially ellipsoidal shape of the near field pattern NFP rotates approximately 90 degrees with respect to the above-described projecting surface close to the laser light-emitting surface LD-LS of the laser chip LD.

The wavelength converting board FC having the incident surface FC-IN and the light-emitting surface FC-LS can be formed in the substantially planar rectangular shape having a long side LS and a short side NS. The incident surface FC-IN can face the laser light-emitting surface LD-LS, and also can be located in a direction substantially perpendicular to the laser light-emitting surface LD-LS in order to efficiently receive the laser beam EL emitted from the laser chip LD and in order to be able to form a first end LC-1E of an optical fiber LC, which can be arranged easily toward the laser light-emitting surface LD-LS of the package 20 as described later.

Each of the long side LS and the short side NS of the wavelength converting board FC can be located along the long axis direction MJD and the short axis direction MND of the far field pattern FFP, respectively. Additionally, each of the long side LS and the short side NS of the wavelength converting board FC can be located along the long axis direction MJD1 and the short axis direction MND1 of the near field pattern NFP, respectively. The wavelength converting board FC can uniformly receive the laser beam EL emitted from the laser chip LD, which includes a laser beam having a relatively high intensity near the laser optical axis OA, from the incident surface FC-LS thereof by locating the wavelength converting board FC with the above-described locating relation with respect to the laser chip LD.

Therefore, the wavelength converting board FC cannot emit a mixture laser beam such that wavelength-convert the laser beam EL emitted from the laser chip LD by concentrating the laser beam EL into a part thereof, and therefore can emit the mixture laser beam CL having a substantially uniform color tone and a high light-emitting efficiency, which includes a mixture laser beam having a relatively high intensity near the leaser optical axis OA, from the light-emitting surface FC-LS thereof.

A headlight generally provides a light distribution pattern, which includes an approximately rectangular light distribution pattern in a horizontal direction of a road, with drivers. It may be favorable for the headlight to provide the light distribution pattern such that has a high light-intensity near a central portion in a travelling direction of vehicles and has a relatively low light-intensity in an outward direction of the road with the drivers and pedestrians.

In this case, the above-described wavelength converting board FC can be formed in the substantially planar rectangular shape having each of the long side LS and the short side NS, which can be located along the long axis direction MJD and the short axis direction MND of the far field pattern FFP, respectively. Additionally, the wavelength converting board FC can uniformly receive the laser beam EL emitted from the laser chip LD, which includes a laser beam having the relatively high intensity near the leaser optical axis OA, from the incident surface FC-IN thereof, and therefore can emit the mixture laser beam CL having the substantially uniform color tone and the high light-emitting efficiency, which includes the mixture laser beam having the relatively high intensity neat the laser optical axis OA, from the light-emitting surface FC-LS thereof.

Thus, when the semiconductor light-emitting apparatus 10 is used as a light source for the headlight, the semiconductor light-emitting apparatus 10 can become a useful light source to the headlight, which can combine optical devices such as a reflector, a projector lend and the like to provide various favorable light-distribution patterns while making each of unique styles such that match various vehicular designs. Additionally, the headlight using the semiconductor light-emitting apparatus 10 can be formed in a small size, and also can be formed with a simple structure, as described with reference to FIGS. 6a and 6b later.

In the first embodiment of the semiconductor light-emitting apparatus 10, a case where the wavelength converting board FC is formed in the substantially planar rectangular shape. For example, at least one of the incident surface FC-IN and the light-emitting surface FC-LS can include at least one a convex surface and a concave surface to improve a light-emitting efficiency and a light-emitting uniformity. Moreover, the wavelength converting board FC cannot be limited to the substantially rectangular shape if the wavelength converting board FC can uniformly receive whole the laser beam EL emitted from the laser chip LD on the incident surface FC-IN thereof.

Figure 3A:
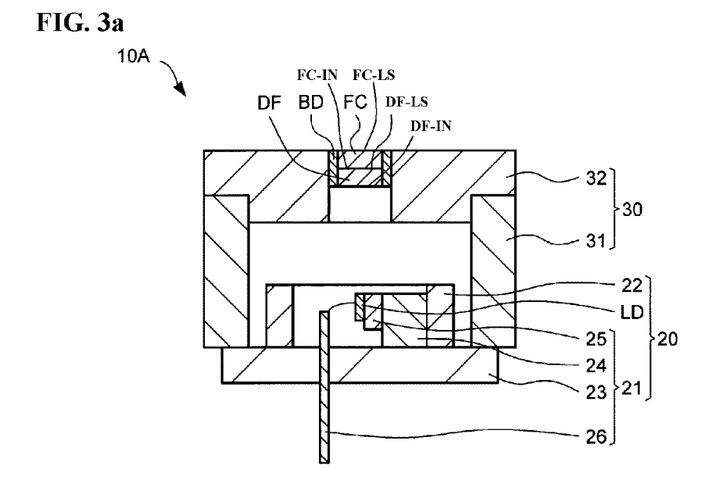
FIG. 3a is an enlarged side cross-sectional view showing a first variation of the first embodiment of the semiconductor light-emitting apparatus shown in FIGS. 1a and 1b.

FIG. 3a is an enlarged side cross-sectional view showing a first variation of the first embodiment of the semiconductor light-emitting apparatus 10 shown in FIGS. 1a and 1b, wherein the first variation shows only the side cross-sectional view corresponding to FIG. 1b. Differences between the first variation and the first embodiment of the semiconductor light-emitting apparatus 10 relate to a light diffusing plate DF, which is located underneath the wavelength converting board FC of the semiconductor light-emitting apparatus 10.

The semiconductor light-emitting apparatus 10A shown in FIG. 3a can be a same structure as the first embodiment except for the light diffusing plate DF. Accordingly, the light diffusing plate DF and elements associating with the diffusing plate DF will now be described here. The holder 30 including the fixing frame 32 having the opening 32PN can attach the converting board holder BD into the opening 32PN, and the converting board holder BD can fix the wavelength converting board FC and the light diffusing plate DF having a diffusing incident surface DF-IN and a diffused light-emitting surface DF-LS into the converting board holder BD.

The diffusing plate DF can be located underneath the wavelength converting board FC so that the diffused light-emitting surface DF-LS can face the incident surface FC-IN of the wavelength converting board FC. Hence, the diffused light-emitting surface DF-LS of the diffusing plate DF can be formed in a substantially same shape as the incident surface FC-IN of the wavelength converting board FC, and the diffusing plate DF can be formed in a substantially planar shape. The diffusing plate DF can be transparent, and can include a transparent ceramic, a sapphire, etc.

In the semiconductor light-emitting apparatus 10A of the first variation, a laser beam EL emitted from the laser light-emitting surface LD-LS of the laser chip LD can enter into the diffusing plate DF via the diffusing incident surface, and can be diffused by the diffusing plate DF. The diffused laser beam can enter into the wavelength converting board FC via the incident surface FC-IN, and the wavelength converting board FC can uniformly receive the diffused laser beam, which includes a laser beam having the relatively high intensity near the laser optical axis OA. Therefore, the semiconductor light-emitting apparatus 10A can adjust a light distribution pattern entering into the wavelength converting board FC, which includes the mixture laser beam having the relatively high intensity neat the laser optical axis OA, from the light-emitting surface FC-LS thereof.

The semiconductor light-emitting apparatus 10A can adjust a light distribution pattern entering into the wavelength converting board FC, which means a shape of the far field pattern FFP formed on the substantially incident surface FC-IN of the wavelength converting board FC, by using the diffusing plate DF. For example, when a manufacturing error occurs in the distance between the laser chip LD and the incident surface FC-IN, the shape of the far field pattern FFP formed on the substantially incident surface FC-IN of the wavelength converting board FC may be subject to a change.

For example, if a smaller shape than the predetermined shape of the far field pattern FFP formed on the substantially incident surface FC-IN enters into the wavelength converting board FC, the wavelength converting board FC of the first embodiment may emit the mixture laser beam CL having a slightly variable color tone. However, the semiconductor light-emitting apparatus 10A can adjust the light distribution pattern entering into the wavelength converting board FC by using the diffusing plate DF, and therefore can emit the mixture laser beam CL having the substantially uniform color tone and the high light-emitting efficiency from the light-emitting surface FC-LS of the wavelength converting board FC in confidence.

Figure 3B:
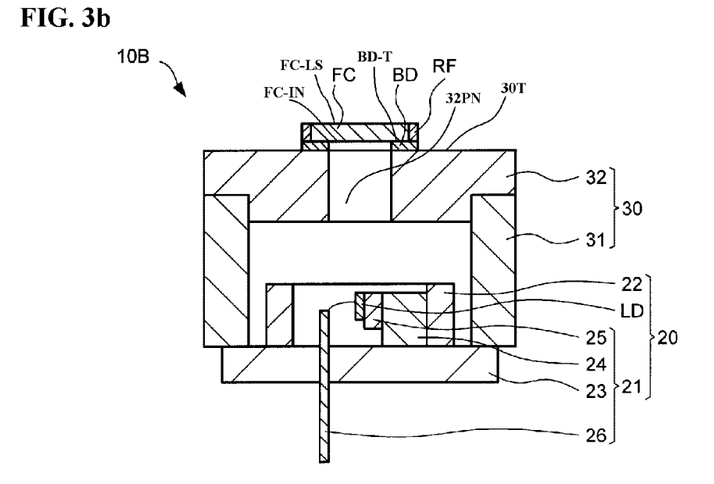
FIG. 3b is an enlarged side cross-sectional view showing a second variation of the first embodiment of the semiconductor light-emitting apparatus shown in FIGS. 1a and 1b.

Next, a second variation of the first embodiment will now be described with reference to FIG. 3b. Differences between the second variation and the semiconductor light-emitting apparatus 10A of the first variation described above relate to a location and the like of the wavelength converting board FC of the semiconductor light-emitting apparatus 10A. Accordingly, the wavelength converting board FC and elements associating with the wavelength converting will now be described here, and descriptions of substantially same portions as the semiconductor light-emitting apparatus 10A will be abbreviated.

The holder 30 including the fixing frame 32 having the opening 32PN can attach the converting board holder BD on a holder top surface 30T thereof, and the converting board holder BD can fix the wavelength converting board FC on a board holder top surface BD-T thereof so that the opening 32PN of the fixing frame 32 can face the incident surface FC-IN of the wavelength converting board FC. Additionally, a reflective body FR can be arranged around the wavelength converting board FC so as to contact the wavelength converting board DC and can be attached on the board holder top surface BD-T of the converting board holder BD. The reflective body FR can include a silicone resin, which contains a filler such as titanic oxide (TiO$_2$), zinc oxide (ZnO$_2$), etc.

Accordingly, in the semiconductor light-emitting apparatus 10B of the second variation, because the wavelength converting board FC can be attached on the holder top surface 30T of the holder 30 via the converting board holder BD by using each of relatively large adhesive regions, an adhesive intensity between the wavelength converting board FC and the holder 30 can improve, and also the reliable semiconductor light-emitting apparatus 10B can expand the design possibility of the wavelength converting board FC.

Moreover, a mixture laser beam directed toward the reflective body FR can return toward the light-emitting surface FC-LS of the wavelength converting board FC with reflective characteristics of the reflective body FR. Therefore, the semiconductor light-emitting apparatus 10B can also emit the mixture laser beam CL having the substantially uniform color tone and the high light-emitting efficiency from the light-emitting surface FC-LS of the wavelength converting board FC with high reliability.

Figure 4:
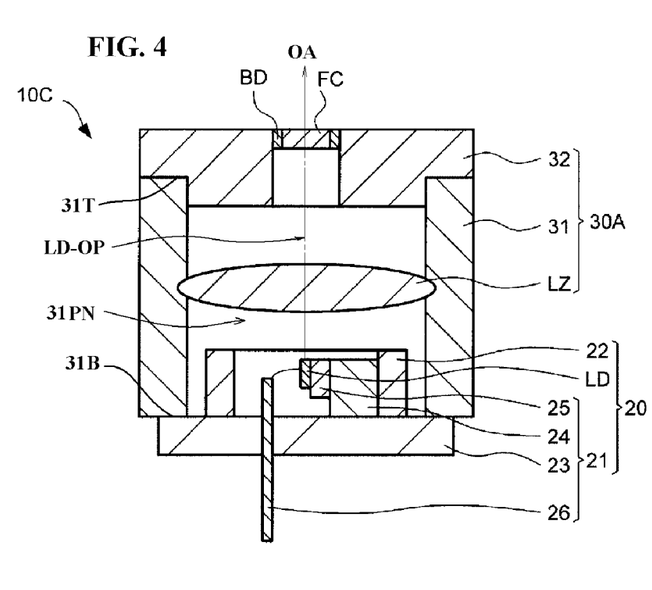
FIG. 4 is an enlarged side cross-sectional view showing a third variation of the first embodiment of the semiconductor light-emitting apparatus shown in FIGS. 1a and 1b, wherein the cross-sectional view of FIG. 4 corresponds to the cross-sectional view shown in FIG. 1b.

A third variation of the first embodiment will now be described with reference to FIG. 4. Differences between the third variation and the first embodiment of the semiconductor light-emitting apparatus 10 relate to an optical lens LZ, which is located between the supporter top surface 31T and the supporter bottom surface 31B of the supporter 31 of the holder 30 of the first embodiment of the semiconductor light-emitting apparatus 10. The semiconductor light-emitting apparatus 10C shown in FIG. 4 can be a same structure as the first embodiment except for the optical lens LZ. Accordingly, the optical lens LZ and elements associating with the optical lens LD will now be described in large part.

The semiconductor light-emitting apparatus 10C can include the optical lens LZ having an optical lens axis LD-OA, which is located between the supporter top surface 31T and the supporter bottom surface 31B of the supporter 31 of the holder, and which crosses a supporter opening 31PN of the supporter 31 formed in a ring shape or a cylindrical shape. Additionally, the optical lens LZ can also be located between the laser chip LD and the wavelength converting board FC, and the optical lens axis LD-OA of the optical lens LZ can correspond to the substantially laser optical axis OA of the laser chip LD.

In this case, the semiconductor light-emitting apparatus 10c can focus the laser beam EL emitted from the laser chip LD toward the wavelength converting board FC via the optical lens LZ. More specifically, a size of the far field pattern FFP formed on the substantially incident surface FC-IN can be adjusted by the optical lens LZ, such as enlarging the far field pattern FFP, decreasing the far field pattern FFP, etc. Therefore, the semiconductor light-emitting apparatus 10C can expand the design possibility of the wavelength converting board FC.

Figure 5:
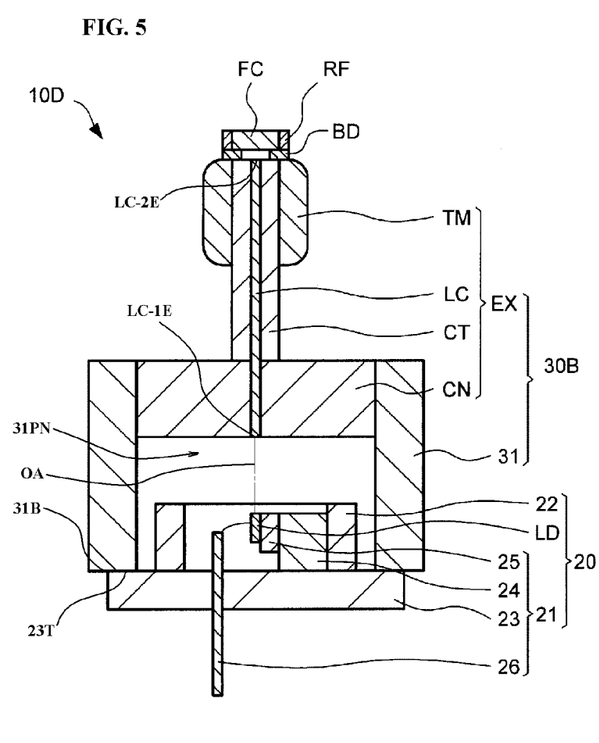
FIG. 5 is an enlarged side cross-sectional view showing a fourth variation of the first embodiment of the semiconductor light-emitting apparatus shown in FIGS. 1a and 1b, wherein the cross-sectional view of FIG. 5 corresponds to the cross-sectional view shown in FIG. 1b.

A fourth variation of the first embodiment will now be described with reference to FIG. 5. Differences between the fourth variation and the first embodiment of the semiconductor light-emitting apparatus 10 relate to a holder 30B. The semiconductor light-emitting apparatus 10D including the holder 30B, which is replaced with the holder 30 shown in FIG. 1b, can be a same structure as the first embodiment except for the holder 30B. Accordingly, the holder 30B and elements associating with the holder 30B will now be described in large part.

The holder 30B of the fourth variation can include a supporter 31 having the supporter bottom surface 31B and the supporter opening 31PN being attached on the base top surface 23T of the base 23, and a light guide portion EX including a connecter CN attached to the supporter 31 in the supporter opening 31PN, an optical fiber LC formed in a liner shape and passing through the connecter CN, a covering layer CT covering the optical fiber LC and a terminal TM connecting the wavelength converting board FC via the converting board holder BD, which attaches the reflective body FR surrounding the wavelength converting board FC as described in the second variation.

The optical fiber LC have a first end LC-1E and a second end LC-2E can made from a quartz, a transparent plastic and the like, and each of the first end LC-1E and the second end LC-2E can be exposed from the connector CN and the covering layer CT, respectively. The laser optical axis OA of the laser chip LD can pass though the exposed first end LC-1E in order for the optical fiber LC to be able to receive the laser beam EL emitted from the laser chip LD, and can transmit the laser beam EL to the second end LC-2E thereof. A FC typed connector, a SC typed connector and the like, which is generally used for an optical fiber, can be used as the connector CN, and also a removable connector CN from the supporter 31 can be used as the connector CN. The terminal TM can be made from a ceramic, a ferrule including a metal such as aluminum (Al), copper (Cu), etc.

In the semiconductor light-emitting apparatus 10D of the fourth variation, the light guide portion EX can receive the laser beam EL emitted from the laser chip LD, and can emit the laser beam EL into the wavelength converting board FC. In this case, when a length of the optical fiber LC is enough long, a shape of the laser beam EL entered into the wavelength converting board FC can become a substantially same shape as a cross-sectional shape of the optical fiber LC, which differs from the far field pattern FFP. When the length of the optical fiber LC is short, the shape of the laser beam EL entered into the wavelength converting board FC can become a similar shape to the far field pattern FFP. Accordingly, the semiconductor light-emitting apparatus 10D can also emit the mixture laser beam CL having the substantially uniform color tone and the high light-emitting efficiency from the light-emitting surface FC-LS of the wavelength converting board FC.

In addition, the semiconductor light-emitting apparatus 10D can expand the design possibility of a location between the wavelength converting board FC and the laser chip LD. Specifically, the first end LC-1E of the optical fiber LC can be arranged easily toward the laser light-emitting surface LD-LS of the package 20, because the optical fiber LC can be formed in a flexible shape, and also the second end LC-2E of the optical fiber LC can be attached easily toward the wavelength converting board FC so that the far field pattern FFP can freely be formed in the substantially incident surface FC-IN of the wavelength converting board FC in accordance with a shape of the incident surface FC-IN. For example, the incident surface FC-IN of the wavelength converting board FC is not necessarily intersected with the laser optical axis OA of the laser chip LD at right angle. Consequently, the semiconductor light-emitting apparatus 10D can expand the design possibility of the laser chip LD.

Moreover, the semiconductor light-emitting apparatus 10D can locate each of the laser chip LD and the wavelength converting board FC, which generates a heat, in a separate position. Thereby, each of generating structures, which is required for the laser chip LD and the wavelength converting board FC, can be designed with a relative small simple structure. Therefore, the semiconductor light-emitting apparatus 10D can also improve a radiating efficiency with a simple structure in addition to a high reliability.

Furthermore, each of the above-described first embodiment, the first variation, the second variation, the third variation and the fourth variation can combine a respective structure with respect to each other. For example, the optical lens LD of features in the third variation can be cooperated into the second variation of the semiconductor light-emitting apparatus 10B and the fourth variation of the semiconductor light-emitting apparatus 10B.

Figure 6A:
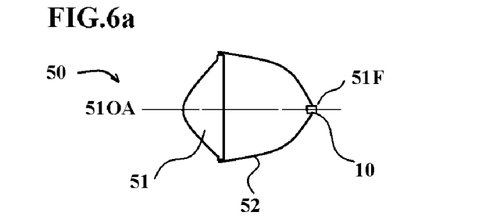
FIGS. 6a and 6b are a schematic cross-sectional view depicting a first exemplary embodiment and a second exemplary of a vehicle headlight using the semiconductor light-emitting apparatus made in accordance with principles of the disclosed subject matter.

Next, exemplary vehicle headlights using the above-described semiconductor light-emitting apparatus will now be described with reference to FIG. 6a and FIG. 6b. FIG. 6a is a schematic cross-sectional view depicting a first exemplary embodiment of a projector typed headlight using the semiconductor light-emitting apparatus 10. The headlight 50 can include: a projector lens 51 having an projector optical axis 51OA and at least one focus 51F located on a substantially the projector optical axis 51OA; a casing 52 attaching the projector lens 51: and the semiconductor light-emitting apparatus 10 located at a substantially the focus 51F of the projector lens 51, wherein the laser optical axis OA of the laser chip LD corresponds to the projector optical axis 51OA of the projector lens 51, and the light-emitting surface FC-LS of the wavelength converting board FC faces the projector lens 51.

The semiconductor light-emitting apparatus 10 can the mixture laser beam CL having the substantially uniform color tone and the high light-emitting efficiency including a substantially white color tone, which includes a mixture laser beam having a relatively high intensity near the leaser optical axis OA. The headlight 50 can provide a favorable light distribution pattern for drivers by using the mixture laser beam CL having a substantially white color tone from the semiconductor light-emitting apparatus 10 via the projector lens 50 with a simple structure.

Figure 6B:
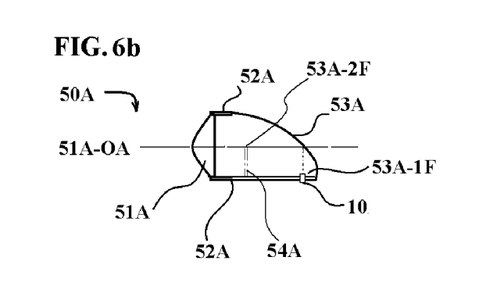

FIG. 6b is a schematic cross-sectional view depicting a second exemplary of the vehicle headlight using the semiconductor light-emitting apparatus. The headlight 50A can include: a projector lens 51A having an projector optical axis 51A-OA and at least one focus 51F located on a substantially the projector optical axis 51OA; a reflector 53A having at least one focus 53A-1F; a casing 52A attaching the projector lens 51A and the reflector 53A: and the semiconductor light-emitting apparatus 10 located at a substantially the focus 53A-1F of the reflector 53A, wherein the light-emitting surface FC-LS of the wavelength converting board FC is located at the substantially focus 53A-1F of the reflector 53A, and the laser optical axis OA of the laser chip LD intersects with a point, where the substantially projector optical axis 51A-OA of the projector lens 51A intersects with the reflector 53A.

Differences between the headlight 50A shown in FIG. 6b and the headlight 50 shown in FIG. 6a relate to the reflector 53A. The headlight 50 can emit the mixture laser beam CL emitted from the semiconductor light-emitting apparatus 10 via the projector lens 51A. However, the headlight 50A can provide a favorable light distribution pattern for drivers via the projector lens 50 after reflecting the mixture laser beam CL having a substantially white color tone from the semiconductor light-emitting apparatus 10 with the reflector 53A. Accordingly, it may be easy for the headlight 50A to provide various favorable light distribution patterns for driver, because the reflector 53A may reflect the mixture laser beam CL once and may direct the useful mixture laser beam CL for the projector lens 51A toward the projector lens 51A.

Additionally, the headlight 50A can also form a favorable light distribution pattern for a low beam by providing a shade 54A near another focus 53A-2F of the reflector 53A. The above-described exemplary embodiments are described in a case, where the semiconductor light-emitting apparatus 10 is used as a light source for the headlights 50 and 50A. Each of the semiconductor light-emitting apparatuses 10A, 10B, 10C and 10D can be used as the light source for the headlights 50 and 50A.

Furthermore, the above-described embodiments are mainly described as a light source device for a vehicle headlight. However, each of the semiconductor light-emitting apparatuses can incorporate various colored lights by combining the above-described laser chip LD with the wavelength converting board FC including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, it is contemplated that any different color chip or different wavelength material can be used in any of the disclosed embodiments and in any combination. Moreover, each of the specifically referenced features of each of the disclosed embodiments can be interchanged with each other in the various embodiments in all possible combinations of the referenced features.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entireties by reference.

What is claimed is:

1. A semiconductor light-emitting apparatus comprising:
a laser chip having a laser optical axis and a laser light-emitting surface including an active layer having a layer thickness and including a ridge structure having a width, the ridge structure extending in a parallel direction with the laser optical axis of the laser chip, the laser light-emitting surface having a long axis direction located in an extending direction of the active layer and a short axis direction located in a direction substantially perpendicular to the active layer, the laser light-emitting surface located on an exposed side surface of the active layer under the ridge structure in a longitudinal direction of the ridge structure, therefore a maximum length of the long axis direction of the laser light-emitting surface being within the substantially width of the ridge structure and a maximum width of the short axis direction of the laser light-emitting surface being within the layer thickness of the active layer;

a package having a base board formed in a substantially planar shape, including a stem on the base board, and also including a sealing portion to cover the laser chip along with the stem, and the package incorporating the laser chip adjacent the base board, wherein the laser light-emitting surface of the laser chip is located in an opposite direction of the base board;

a holder including a supporter having a supporter top surface, a supporter bottom surface and a supporter opening, and including a fixing frame having a frame opening and a peripheral bottom surface, the supporter of the holder formed in a ring shape or a cylindrical shape, connecting the fixing frame between the peripheral bottom surface of the fixing frame and the supporter top surface of the supporter, attached on the base board of the package via the supporter bottom surface of the supporter, and thereby surrounding the laser chip;

a converting board holder formed in a ring shape, and attached into the frame opening of the fixing frame; and a wavelength converting board having an incident surface and a light-emitting surface formed in a substantially planar shape, each of the incident surface and the light-emitting surface of the wavelength converting board is formed in a substantially rectangular shape having a long side and a short side, the wavelength converting board incorporated into the converting board holder, wherein the laser optical axis of the laser chip passes though the supporter opening of the supporter and the frame opening of the fixing frame, and intersects with each of the incident surface and the light-emitting surface of the wavelength converting board at a substantially right angle, and wherein the wavelength converting board receives a light distribution pattern of a far field pattern formed in a substantially enlarged ellipsoidal shape having a long axis and a short axis using a substantially ellipsoidal shape of a near field pattern, in which each of the long axis and the short axis of the far field pattern is located along the long side and the short side of the wavelength converting board, respectively, and therefore the semiconductor light-emitting apparatus enables the wavelength converting board to project substantially all of a laser beam emitted from the laser chip as a mixture beam.

2. A semiconductor light-emitting apparatus comprising:

a laser chip having a laser optical axis and a laser light-emitting surface including an active layer having a layer thickness, and including a ridge structure having a width, the ridge structure extending in a parallel direction with the laser optical axis of the laser chip, the laser light-emitting surface having a long axis direction located in an extending direction of the active layer and a short axis direction located in a direction substantially perpendicular to the active layer, the laser light-emitting surface located on an exposed side surface of the active layer under the ridge structure in a longitudinal direction of the ridge structure, therefore a maximum length of the long axis direction of the laser light-emitting surface being within the substantially width of the ridge structure and a maximum width of the short axis direction of the laser light-emitting surface being within the layer thickness of the active layer;

a package having a base board formed in a substantially planar shape, including a stem on the base board, and also including a sealing portion to cover the laser chip along with the stem, and the package incorporating the laser chip adjacent the base board, wherein the laser light-emitting surface of the laser chip is located in an opposite direction of the base board;

a holder including a supporter having a supporter top surface, a supporter bottom surface and a supporter opening, and including a fixing frame having a holder top surface, a frame opening and a peripheral bottom surface, the supporter of the holder formed in a ring shape or a cylindrical shape, connecting the fixing frame between the peripheral bottom surface of the fixing frame and the supporter top surface of the supporter, attached on the base board of the package via the supporter bottom surface of the supporter, and thereby surrounding the laser chip;

a converting board holder having a board holder top surface formed in a ring shape, and attached on the holder top surface of the fixing frame of the holder;

a wavelength converting board having an incident surface and a light-emitting surface formed in a substantially planar shape, each of the incident surface and the light-emitting surface of the wavelength converting board is formed in a substantially rectangular shape having a long side and a short side, the wavelength converting board incorporated into the converting board holder, and attached on the board holder top surface of the converting board holder; and a reflective body formed in a ring shape, attached on the board holder top surface of the converting board holder, surrounding the wavelength converting board and contacting with the wavelength converting board, wherein the laser optical axis of the laser chip passes though the supporter opening of the supporter, the frame opening of fixing frame and the reflective body formed in the ring shape, and intersects with each of the incident surface and the light-emitting surface of the wavelength converting board at a substantially right angle, and wherein the wavelength converting board receives a light distribution pattern of a far field pattern formed in a substantially enlarged ellipsoidal shape having a long axis and a short axis using a substantially ellipsoidal shape of a near field pattern, in which each of the long axis and the short axis of the far field pattern is located along the long side and the short side of the wavelength converting board, respectively, and therefore the semiconductor light-emitting apparatus enables the wavelength converting board to project substantially all of a laser beam emitted from the laser chip as a mixture beam.

3. A semiconductor light-emitting apparatus comprising:

a laser chip having a laser optical axis and a laser light-emitting surface including an active layer having a layer thickness, and including a ridge structure having a width, the ridge structure extending in a parallel direction with the laser optical axis of the laser chip, the laser light-emitting surface having a long axis direction located in an extending direction of the active layer and a short axis direction located in a direction substantially perpendicular to the active layer, the laser light-emitting surface located on an exposed side surface of the active layer under the ridge structure in a longitudinal direction of the ridge structure, therefore a maximum length of the long axis direction of the laser light-emitting surface being within the substantially width of the ridge structure and a maximum width of the short axis direction of the laser light-emitting surface being within the layer thickness of the active layer;

a package having a base board formed in a substantially planar shape, including a stem on the base board, and also including a sealing portion to cover the laser chip along with the stem, and the package incorporating the laser chip adjacent the base board, wherein the laser light-emitting surface of the laser chip is located in an opposite direction of the base board;

a holder including a supporter having a supporter bottom surface and a supporter opening, and including a light guide portion, the light guide portion including a connecter attached into the supporter opening of the supporter, an optical fiber having a first end and a second end passing through the connecter, a covering layer covering the optical fiber and a terminal fixing the covering layer, each of the first end and the second end of the optical fiber being exposed from the connector and the covering layer, respectively, the supporter of the holder attached on the base board of the package via the supporter bottom surface of the supporter, and thereby surrounding the laser chip;

a converting board holder formed in a ring shape, and attached to the terminal of the light guide portion of the holder; and a wavelength converting board having an incident surface and a light-emitting surface formed in a substantially planar shape, each of the incident surface and the light-emitting surface of the wavelength converting board is formed in a substantially rectangular shape, the wavelength converting board incorporated into the converting board holder, wherein the laser optical axis of the laser chip intersects with the first end of the optical fiber of the holder, and the second end of the optical fiber of the holder faces the wavelength converting board, and wherein the wavelength converting board receives a light distribution pattern of a far field pattern formed in a substantially enlarged ellipsoidal shape having a long axis and a short axis using a substantially ellipsoidal shape of a near field pattern, in which each of the long axis and the short axis of the far field pattern is located along the long side and the short side of the wavelength converting board, respectively, and therefore the semiconductor light-emitting apparatus enables the wavelength converting board to project substantially all of a laser beam emitted from the laser chip as a mixture beam.

4. The semiconductor light-emitting apparatus according to claim 1, further comprising:
a light diffusing plate formed in a substantially planar shape, and arranged underneath the incident surface of the wavelength converting layer.

5. The semiconductor light-emitting apparatus according to claim 2, further comprising:
a light diffusing plate formed in a substantially planar shape, and arranged underneath the incident surface of the wavelength converting layer.

6. The semiconductor light-emitting apparatus according to claim 3, further comprising:
a light diffusing plate formed in a substantially planar shape, and arranged underneath the incident surface of the wavelength converting layer.

7. The semiconductor light-emitting apparatus according to claim 1, further comprising:
an optical lens having an optical lens axis being located between the supporter top surface and the supporter bottom surface of the supporter of the holder, and crossing the supporter opening of the supporter, and the optical lens axis of the optical lens corresponding to the substantially optical axis of the laser chip.

8. The semiconductor light-emitting apparatus according to claim 2, further comprising:
an optical lens having an optical lens axis being located between the supporter top surface and the supporter bottom surface of the supporter of the holder, and crossing the supporter opening of the supporter, and the optical lens axis of the optical lens corresponding to the substantially optical axis of the laser chip.

9. A vehicle headlight including the semiconductor light-emitting apparatus according to claim 1, further comprising:
a projector lens having a projector optical axis and at least one focus located on the substantially projector optical axis, the projector optical axis of the projector lens corresponding substantially to the laser optical axis of the laser chip of the semiconductor light-emitting apparatus, which is located at the substantially focus of the projector lens, and the projector lens facing the light-emitting surface of the wavelength converting board of the semiconductor light-emitting apparatus; and
a casing attaching the projector lens and the semiconductor light-emitting apparatus.

10. A vehicle headlight including the semiconductor light-emitting apparatus according to claim 2, further comprising:
a projector lens having a projector optical axis and at least one focus located on the substantially projector optical axis, the projector optical axis of the projector lens corresponding substantially to the laser optical axis of the laser chip of the semiconductor light-emitting apparatus, which is located at the substantially focus of the projector lens, and the projector lens facing the light-emitting surface of the wavelength converting board of the semiconductor light-emitting apparatus; and
a casing attaching the projector lens and the semiconductor light-emitting apparatus.

11. A vehicle headlight including the semiconductor light-emitting apparatus according to claim 1, further comprising:
a projector lens having a projector optical axis;
a reflector having at least one focus facing the projector lens, and intersecting with the projector optical axis of the projector lens;
the light-emitting surface of the wavelength converting board of the semiconductor light-emitting apparatus located at the substantially focus of the reflector, and facing the reflector, and the laser optical axis of the laser chip of the semiconductor light-emitting apparatus intersecting with a substantially point where the projector optical axis of projector lens intersects with the reflector; and
a casing attaching the projector lens, the reflector and the semiconductor light-emitting apparatus.

12. A vehicle headlight including the semiconductor light-emitting apparatus according to claim 2, further comprising:
a projector lens having a projector optical axis;
a reflector having at least one focus facing the projector lens, and intersecting with the projector optical axis of the projector lens;
the light-emitting surface of the wavelength converting board of the semiconductor light-emitting apparatus located at the substantially focus of the reflector, and facing the reflector, and the laser optical axis of the laser chip of the semiconductor light-emitting apparatus intersecting with a substantially point where the projector optical axis of projector lens intersects with the reflector; and
a casing attaching the projector lens, the reflector and the semiconductor light-emitting apparatus.

13. The semiconductor light-emitting apparatus according to claim 3, further comprising:
an optical lens having an optical lens axis being located between the supporter top surface and the supporter bottom surface of the supporter of the holder, and crossing the supporter opening of the supporter, and the optical lens axis of the optical lens corresponding to the substantially optical axis of the laser chip.

14. A vehicle headlight including the semiconductor light-emitting apparatus according to claim 3, further comprising:
a projector lens having a projector optical axis and at least one focus located on the substantially projector optical axis, the projector optical axis of the projector lens corresponding substantially to the laser optical axis of the laser chip of the semiconductor light-emitting apparatus, which is located at the substantially focus of the projector lens, and the projector lens facing the light-emitting surface of the wavelength converting board of the semiconductor light-emitting apparatus; and
a casing attaching the projector lens and the semiconductor light-emitting apparatus.

15. A vehicle headlight including the semiconductor light-emitting apparatus according to claim 7, further comprising:
a projector lens having a projector optical axis and at least one focus located on the substantially projector optical axis, the projector optical axis of the projector lens corresponding substantially to the laser optical axis of the laser chip of the semiconductor light-emitting apparatus, which is located at the substantially focus of the projector lens, and the projector lens facing the light-emitting surface of the wavelength converting board of the semiconductor light-emitting apparatus; and
a casing attaching the projector lens and the semiconductor light-emitting apparatus.

16. A vehicle headlight including the semiconductor light-emitting apparatus according to claim 8, further comprising:
a projector lens having a projector optical axis and at least one focus located on the substantially projector optical axis, the projector optical axis of the projector lens corresponding substantially to the laser optical axis of the laser chip of the semiconductor light-emitting apparatus, which is located at the substantially focus of the projector lens, and the projector lens facing the light-emitting surface of the wavelength converting board of the semiconductor light-emitting apparatus; and
a casing attaching the projector lens and the semiconductor light-emitting apparatus.

17. A vehicle headlight including the semiconductor light-emitting apparatus according to claim 13, further comprising:
a projector lens having a projector optical axis and at least one focus located on the substantially projector optical axis, the projector optical axis of the projector lens corresponding substantially to the laser optical axis of the laser chip of the semiconductor light-emitting apparatus, which is located at the substantially focus of the projector lens, and the projector lens facing the light-emitting surface of the wavelength converting board of the semiconductor light-emitting apparatus; and
a casing attaching the projector lens and the semiconductor light-emitting apparatus.

18. A vehicle headlight including the semiconductor light-emitting apparatus according to claim 3, further comprising:
a projector lens having a projector optical axis;
a reflector having at least one focus facing the projector lens, and intersecting with the projector optical axis of the projector lens;
the light-emitting surface of the wavelength converting board of the semiconductor light-emitting apparatus located at the substantially focus of the reflector, and facing the reflector, and the laser optical axis of the laser chip of the semiconductor light-emitting apparatus intersecting with a substantially point where the projector optical axis of projector lens intersects with the reflector; and
a casing attaching the projector lens, the reflector and the semiconductor light-emitting apparatus.

19. A vehicle headlight including the semiconductor light-emitting apparatus according to claim 13, further comprising:
a projector lens having a projector optical axis;
a reflector having at least one focus facing the projector lens, and intersecting with the projector optical axis of the projector lens;
the light-emitting surface of the wavelength converting board of the semiconductor light-emitting apparatus located at the substantially focus of the reflector, and facing the reflector, and the laser optical axis of the laser chip of the semiconductor light-emitting apparatus intersecting with a substantially point where the projector optical axis of projector lens intersects with the reflector; and
a casing attaching the projector lens, the reflector and the semiconductor light-emitting apparatus.

* * * * *